(12) United States Patent
Ristic et al.

(10) Patent No.: US 9,531,161 B2
(45) Date of Patent: Dec. 27, 2016

(54) LIGHT-EMITTING ASSEMBLY HAVING A SEMICONDUCTOR LAYER SEQUENCE HAVING AN ACTIVE ZONE ON A COLUMNAR STRUCTURE

(71) Applicant: OSRAM Opto Semiconductors GmbH, Regensburg (DE)

(72) Inventors: Jelena Ristic, Regensburg (DE);
Martin Straβburg, Donaustauf (DE);
Martin Mandl, Lappersdorf (DE);
Alfred Lell, Maxhütte-Haidhof (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/785,090

(22) PCT Filed: Apr. 17, 2014

(86) PCT No.: PCT/EP2014/057933
§ 371 (c)(1),
(2) Date: Oct. 16, 2015

(87) PCT Pub. No.: WO2014/173820
PCT Pub. Date: Oct. 30, 2014

(65) Prior Publication Data
US 2016/0087150 A1    Mar. 24, 2016

(30) Foreign Application Priority Data

Apr. 26, 2013   (DE) .................. 10 2013 104 273

(51) Int. Cl.
*H01S 5/00*      (2006.01)
*H01S 5/20*      (2006.01)
(Continued)

(52) U.S. Cl.
CPC ......... *H01S 5/2077* (2013.01); *H01L 25/0753* (2013.01); *H01L 27/156* (2013.01);
(Continued)

(58) Field of Classification Search
CPC .............. H01S 5/18; H01S 5/183; H01S 5/42; H01S 5/4025; H01S 5/405; H01S 5/2077
(Continued)

(56) References Cited

U.S. PATENT DOCUMENTS

2005/0127391 A1* 6/2005 Yanamoto ............. B82Y 20/00
                                                        257/103
2007/0200135 A1    8/2007 Wang
(Continued)

FOREIGN PATENT DOCUMENTS

DE    10 2010 012 711 A1    9/2011
JP         2007067418        3/2007
(Continued)

OTHER PUBLICATIONS

Adrian Avramescu et al., "InGaN laser diodes with 50 mW output power emitting at 515 nm," Applied Physics Letters, vol. 95, Aug. 17, 2009, pp. 071103-1-071103-3.
(Continued)

*Primary Examiner* — Kinam Park
(74) *Attorney, Agent, or Firm* — DLA Piper LLP (US)

(57) ABSTRACT

An assembly has a columnar structure arranged with one end on a substrate, wherein the structure is at least partly covered with a semiconductor layer structure having an active zone that generates electromagnetic radiation, the active zone has a band gap for a radiative recombination, and the band gap decreases along a longitudinal axis of the structure in a direction of a free end of the structure such that a diffusion of charge carriers in the direction of the free end of the structure and a radiative recombination of charge carrier
(Continued)

pairs in the region of the free end of the structure are supported.

18 Claims, 8 Drawing Sheets

(51) Int. Cl.
| | |
|---|---|
| *H01S 5/18* | (2006.01) |
| *H01S 5/40* | (2006.01) |
| *H01S 5/183* | (2006.01) |
| *H01S 5/42* | (2006.01) |
| *H01L 27/15* | (2006.01) |
| *H01L 33/06* | (2010.01) |
| *H01L 33/24* | (2010.01) |
| *H01L 33/32* | (2010.01) |
| *H01L 33/18* | (2010.01) |
| *H01L 25/075* | (2006.01) |
| *H01L 33/00* | (2010.01) |
| *H01L 33/14* | (2010.01) |

(52) U.S. Cl.
CPC .......... *H01L 33/0075* (2013.01); *H01L 33/06* (2013.01); *H01L 33/14* (2013.01); *H01L 33/18* (2013.01); *H01L 33/24* (2013.01); *H01L 33/32* (2013.01); *H01S 5/18* (2013.01); *H01S 5/183* (2013.01); *H01S 5/405* (2013.01); *H01S 5/4025* (2013.01); *H01S 5/42* (2013.01); *H01L 2924/0002* (2013.01); *H01L 2933/0033* (2013.01)

(58) Field of Classification Search
USPC .................. 372/0.12, 50.124, 50.1
See application file for complete search history.

(56) References Cited

U.S. PATENT DOCUMENTS

| | | | |
|---|---|---|---|
| 2011/0140072 A1 | 6/2011 | Varangis et al. | |
| 2011/0169025 A1 | 7/2011 | Kishino et al. | |
| 2011/0254034 A1 | 10/2011 | Konsek et al. | |
| 2012/0068153 A1 | 3/2012 | Seong et al. | |
| 2012/0235117 A1 | 9/2012 | Fukui et al. | |
| 2012/0287958 A1* | 11/2012 | Lell ........................ | H01S 5/4043 372/45.01 |
| 2013/0020553 A1* | 1/2013 | Han ........................ | H01L 33/06 257/13 |

FOREIGN PATENT DOCUMENTS

| | | |
|---|---|---|
| JP | 2008544536 | 12/2008 |
| JP | 2009049209 | 3/2009 |
| JP | 2009147140 | 7/2009 |
| WO | 2010/023921 A1 | 3/2010 |
| WO | 2011/069769 A2 | 6/2011 |
| WO | 2011/117056 A1 | 9/2011 |

OTHER PUBLICATIONS

Notice of Reasons for Rejections dated Oct. 4, 2016, from corresponding Japanese Patent Application No. 2016-509405.

* cited by examiner

LIGHT-EMITTING ASSEMBLY HAVING A SEMICONDUCTOR LAYER SEQUENCE HAVING AN ACTIVE ZONE ON A COLUMNAR STRUCTURE

TECHNICAL FIELD

This disclosure relates to an assembly, a method of producing an assembly, and an array comprising a plurality of assemblies.

BACKGROUND

DE 10 2010 012 711 A1 discloses a method of producing an assembly comprising a columnar structure covered with a semiconductor layer structure having an active zone that generates electromagnetic radiation, wherein the active zone has a band gap for a radiative recombination.

It could nonetheless be helpful to provide an improved assembly having, in particular, better properties in relation to generation of electromagnetic radiation. Furthermore, it could be helpful to provide an improved method of producing assemblies and an improved array of assemblies.

SUMMARY

We provide an assembly including a columnar structure arranged with one end on a substrate, wherein the structure is at least partly covered with a semiconductor layer structure having an active zone that generates electromagnetic radiation, the active zone has a band gap for a radiative recombination, and the band gap decreases along a longitudinal axis of the structure in a direction of a free end of the structure such that a diffusion of charge carriers in the direction of the free end of the structure and a radiative recombination of charge carrier pairs in the region of the free end of the structure are supported.

We also provide a method of producing the assembly including a columnar structure arranged with one end on a substrate, wherein the structure is at least partly covered with a semiconductor layer structure having an active zone that generates electromagnetic radiation, the active zone has a band gap for a radiative recombination, and the band gap decreases along a longitudinal axis of the structure in a direction of a free end of the structure such that a diffusion of charge carriers in the direction of the free end of the structure and a radiative recombination of charge carrier pairs in the region of the free end of the structure are supported, and wherein a columnar structure composed of an electrically conductive material composed of a semiconductor material, is produced on a substrate, and a semiconductor layer structure having an active zone that generates electromagnetic radiation is formed at least one part of the structure such that a band gap of the active zone for a radiative recombination of charge carriers decreases along a longitudinal axis of the structure in the direction of a free end of the structure such that a diffusion of charge carriers in the direction of the free end of the structure and a radiative recombination of charge carrier pairs in the region of the free end of the structure are supported.

We further provide an array including a substrate and a plurality of assemblies, each assembly including a columnar structure arranged with one end on the substrate, wherein the structure is at least partly covered with a semiconductor layer structure having an active zone that generates electromagnetic radiation, wherein the active zone has a band gap for a radiative recombination, the band gap decreases along a longitudinal axis of the structure in a direction of a free end of the structure such that a diffusion of charge carriers in the direction of the free end of the structure and a radiative recombination of charge carrier pairs in the region of the free end of the structure are supported, and a higher density of assemblies is provided in at least one direction than in at least one second direction.

We also further provide an assembly including a columnar structure arranged with one end on a substrate, wherein the structure is at least partly covered with a semiconductor layer structure having an active zone that generates electromagnetic radiation, the active zone has a band gap for a radiative recombination, the band gap decreases along a longitudinal axis of the structure in the direction of a free end of the structure such that a diffusion of charge carriers in the direction of the free end of the structure and a radiative recombination of charge carrier pairs in the region of the free end of the structure are supported, and a material composition of a quantum well layer changes at least in one section in the direction of the free end of the structure such that the band gap decreases in the direction of the free end of the structure.

LIST OF REFERENCE SIGNS

1 Assembly
2 Substrate
3 Mask layer
4 Hole
5 Structure
6 Semiconductor layer structure
7 Active zone
8 Outer layer
9 Outer area
10 First section
11 Second section
12 Plane
13 Contact layer
14 Mirror layer
15 Further contact
16 Insulation layer
17 Row
18 Preferred direction
19 Region
20 First region
21 Second region
22 Third region 23 Third section
24 Further contact layer
25 Free end
26 Upper point

DETAILED DESCRIPTION

An assembly can be produced, in particular, by a method described here. Furthermore, an array described here can be formed, in particular, with assemblies described here. That is to say that all features and feature combinations described here are disclosed for the assembly, the method and the array.

One advantage of the assembly described is that the electromagnetic radiation is generated with greater probability in the upper free end region of the columnar structure. The efficiency and emission of the electromagnetic radiation are improved as a result.

This is achieved because the semiconductor layer structure having the active zone is formed such that the band gap of the active zone for a radiative recombination decreases in the direction of the free end of the columnar structure. The band gap thus decreases along a longitudinal axis or height of the columnar structure. By way of example, the band gap can decrease at least in one section of the active zone along the longitudinal axis of the assembly. The band gap can decrease uniformly and/or nonuniformly and/or continuously and/or discontinuously and/or in a plurality of steps. In addition, it is also possible to provide sections along the longitudinal axis in which the band gap of the active zone remains constant. As a result of the band gap decreasing at least in sections along the longitudinal axis, free charge carriers are moved in the direction of the free end of the structure. The probability of the charge carriers recombining radiatively in the region of the upper free end of the structure is thus increased.

The thickness of the quantum well layer of the active zone may increase in the direction of the free end of the structure. As a result, with an otherwise unchanged construction, the band gap decreases in the direction of the free end of the columnar structure. Influencing the thickness of the quantum well layer can be achieved by a corresponding setting of method parameters during deposition of the quantum well layer. A simple production of the assembly is thus possible.

The active zone may be formed such that a material composition of the active zone changes in the direction of the free end of the columnar structure such that the band gap for a radiative recombination decreases in the direction of the free end of the structure. Influencing the material composition of the active zone, in particular the material composition of the quantum well layer, can be achieved with the aid of simple parameters such as, e.g., the gas flow, the gas composition, the temperature or the supply of the individual materials during the deposition of the active zone or the quantum well layer.

The active zone, in particular a quantum well layer, may comprise an InGaN layer. In this example, the change in the band gap can be set, e.g., by a change in the concentration of indium. The concentration of indium in the active zone, in particular in a quantum well layer of the active zone, can increase, for example, by up to 30% in the direction of the free structure. A high concentration of the free charge carriers in the region of the free end of the structure is achieved as a result.

The active zone may extend over a large portion of the outer area of the structure. In other words, the active zone is not just formed at the tip of the structure rather, for example, the entire lateral surface region of the structure, in so far as it is exposed, has the active zone. By way of example, at least 85% of the surface area of the columnar structure is covered with the active zone. In this way, it is possible for charge carriers from a particularly large region, namely almost the entire lateral surface area of the structure, to be available for diffusion toward the free end of the structure. The efficiency of generating radiation at the free end of the structure is increased as a result.

The columnar structure may have a crystal structure. In this case, an outer area of the structure undergoes transition from a first crystal plane into at least one second crystal plane in the direction of the free end of the structure. The active zone is formed on the at least two crystal planes such that the band gap decreases from the first crystal plane to the second crystal plane. This, too, supports concentration of free charge carriers at the free end of the structure.

By way of example, the band gap of the active zone can decrease within a plane of the active zone continuously and/or in a plurality of steps in the direction of the free end of the structure. Along a longitudinal axis of the structure it is possible to provide more than two crystal planes inclined with respect to one another and thus also more than two planes of the active zone inclined with respect to one another along the longitudinal axis of the structure, wherein the band gap of the active zone decreases continuously and/or in a stepwise manner within a plane of the active zone in the direction of the free end of the structure.

An electrical contact may be provided at the free end of the structure, which electrical contact can be used to electrically bias the active zone in the region of the free end. The electrical biasing exerts a force on the free charge carriers which pulls the free charge carriers in the direction of the free end of the structure. This, too, increases the probability of a radiative recombination of the charge carrier pairs in the region of the free end of the structure.

The active zone can comprise indium, aluminum and/or gallium. In addition, the active zone can comprise layers, in particular quantum well layers comprising indium gallium nitride. Indium, gallium, aluminum and nitrogen are materials which can be used for production of active zones in particular comprising quantum well layers, wherein the properties of the materials and in particular of the ternary structure of the materials mentioned are very well known and a desired semiconductor layer structure having an active zone can therefore be produced in a reliable manner.

The active zone and in particular at least one quantum well layer of the active zone can also comprise other or additional materials of main group III and/or V of the periodic table of the chemical elements and dopants from other main groups and/or subgroups, for example, elements from groups IV, IIa, IIb and VI. In this case, it is also possible to use quaternary material compositions for the active zone, with which compositions a columnar structure having an active zone can be produced, wherein the band gap of the active zones for a radiative recombination decreases in the direction of a free end 25 of the columnar structure 5.

The active zone may comprise layers comprising indium gallium phosphide. In addition, the active zone can also comprise aluminum and/or as group V element arsenic and/or antimony. This material combination, too, has been well researched and can therefore be used reliably to form active zones comprising quantum well layers that generate electromagnetic radiation.

The columnar structure may have two sections. In a first section, proceeding from a substrate, the diameter increases with the distance from the substrate. In an adjacent second section, the diameter of the columnar structure tapers in the direction of the free end. A larger surface area and thus a larger area of the active zone are achieved with the aid of this assembly. The larger area of the active zone results in a higher yield for the radiative recombination of the charge carriers.

The columnar structure may be a plane arranged substantially transversely, in particular perpendicular, with respect to a longitudinal axis of the columnar structure provided at the free end of the structure. A corresponding planar layer of the active zone is also formed on the plane, wherein the band gap for a radiative recombination of charge carriers is smaller than on adjoining side areas of the columnar structure.

The assembly described is particularly suitable to produce an array comprising a plurality of assemblies, wherein a higher density of assemblies is provided at least in a first direction than in at least one second direction. An amplification of the emission of the electromagnetic radiation in the first direction is achieved in this way. As a result, it is possible to achieve higher radiances in the first direction without the use of mirrors.

At least two rows of assemblies may be provided, which are aligned parallel to one another. A simple structure having an amplified light emission in one direction is provided as a result.

The array may comprise at least two regions of rows, wherein at least two rows of assemblies are arranged parallel in each region. The two regions are arranged parallel to one another. In addition, the two regions are at a distance from one another perpendicularly in relation to the alignment of the rows of assemblies, which distance is greater than an average distance between two adjacent assemblies of the same region. Strip-like regions which improve the formation of electromagnetic radiation parallel to one direction are provided in this way.

The assemblies of the different regions can be different regions that generate electromagnetic radiation having different frequencies. As a result, different colors can be provided with the aid of an array. By way of example, the assemblies are suitable to form an array of assemblies which are excited to radiate by a radiation source with electromagnetic radiation.

Furthermore, an array of assemblies can be used to form a sensor that can detect electromagnetic radiation.

The above-described properties, features and advantages and the way in which they are achieved will become clearer and more clearly understood in association with the following description of the examples explained in greater detail in association with the drawings.

Figure 1:
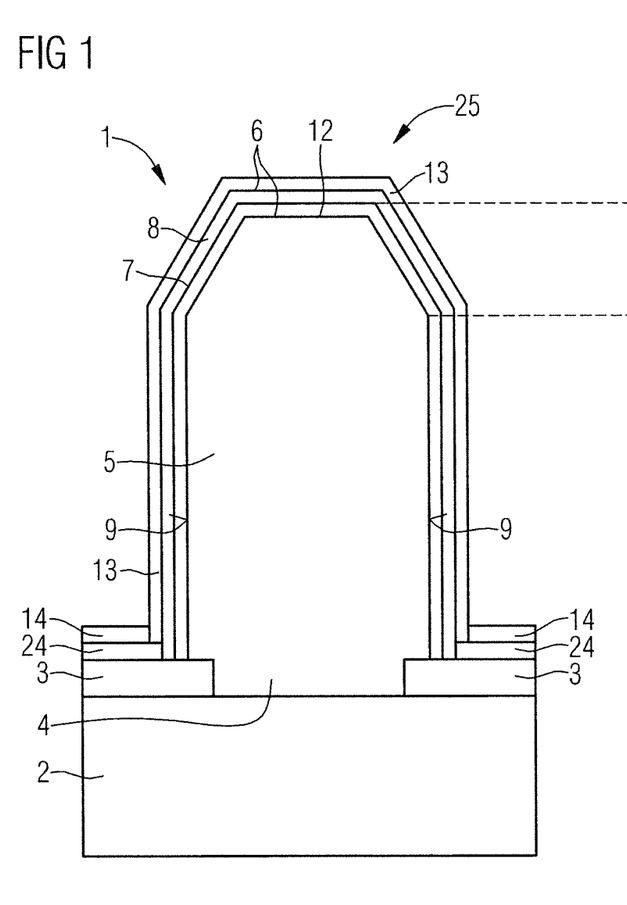
FIG. 1 illustrates a schematic construction of an assembly.

FIG. 1 shows a schematic cross section through an assembly 1. The assembly 1 is arranged on a substrate 2. A mask layer 3 composed of silicon oxide or composed of SiN, for example, is applied on the substrate 2. The mask layer 3 can be created by a vapor deposition (CVD) and have a thickness of 100 nm. The substrate 2 is formed, for example, from sapphire or a template layer composed, inter alia, of n-conducting GaN.

The mask layer 3 has a hole 4 through which a columnar structure 5 extends. The columnar structure 5 constitutes a nanorod. The hole 4 can be introduced into the mask layer 3 with the aid of various methods such as, e.g., with the aid of a photolithographic method, with the aid of a laser, with the aid of a nano-imprint method of marking the position of the hole and an etching step such as, e.g., an RIE method or a wet-chemical method. The hole 4 can have, e.g., a diameter of 200 nm. The structure 5 extends away from the plane of the substrate 2 and is aligned, for example, substantially perpendicularly to the plane of the substrate 2. The columnar structure 5 is produced from a conductive material or has an electrically conductive layer at least on a surface. By way of example, the structure 5 is formed from an electrically conductive semiconductor material, in particular from gallium nitride, and is negatively doped, for example, with silicon. In this example, the columnar structure 5 has a crystal structure corresponding to the greatest possible extent to the crystal structure of the sapphire or of the template layer. For this purpose, the structure 5 is grown epitaxially on the substrate 2, for example, with the aid of a vapor phase epitaxy (MOVPE). The structure 5 has a hexagonal wurtzite structure, for example, the c-axis of which is aligned away from the plane of the substrate 2, for example, substantially perpendicular to the plane of the substrate 2. A semiconductor layer structure 6 is applied on a surface of the columnar structure 5. The semiconductor layer structure 6 has an active zone 7 that is a three-dimensional cladding layer on the surface of the structure 5. To generate electromagnetic radiation, the active zone 7 has, for example, a plurality of layers, in particular one or a plurality of quantum well layers, which are separated from one another by barrier layers in the form of intermediate layers. In this case, the individual layers are arranged one above another parallel to the surface of the structure 5. A positively doped semiconductor layer is applied to the active zone 7, and forms an outer layer 8. The structure 5 together with the semiconductor layer structure 6 and the outer layer 8 forms an LED structure having a pn junction arranged perpendicularly to the surface of the structure 5 and constitutes a three-dimensional active zone 7 that generates electromagnetic radiation. It is also possible to provide further layers between the structure 5 and the semiconductor layer structure 6 and/or between the semiconductor layer structure 6 and the outer layer 8.

The active zone 7 comprises, for example, indium and gallium, in particular layers composed of indium gallium nitride or indium gallium phosphide. The outer layer 8 is formed from aluminum gallium nitride, for example, wherein magnesium, for example, is used for a positive doping. The active zone and in particular at least one quantum well layer of the active zone and/or the outer layer 8 can also comprise other and/or additional materials of main group III and/or V of the periodic table of the chemical elements and dopants from other main groups and/or subgroups, for example, elements from groups IV, IIa, IIb and VI. In this case, it is possible to use ternary and/or quaternary material compositions for the active zone 7, with which compositions a columnar structure having an active zone can be covered, wherein the band gap of the active zones for a radiative recombination decreases in the direction of a free end 25 of the columnar structure 3.

A lateral outer area 9 of the structure 5 can be arranged substantially perpendicularly to the surface of the substrate 2. Furthermore, in one example illustrated in FIG. 1, the diameter of the structure 5 can increase in a first section 10 with increasing distance from the substrate 2. In this example, the lateral outer areas 9 in the first section 10 are arranged perpendicularly to the substrate 2. The outer areas 9 can also be arranged in a manner inclined inward or outward. The lateral outer areas 9 in the first section 10 are arranged in accordance with the perpendicular non-polar m- or a-planes or the inwardly or outwardly inclined semipolar planes of the wurtzite crystal. By way of example, the outer areas 9 can be arranged in a manner inclined inward or outward and can be at an angle of less than 5° with respect to an axis that is perpendicular to the substrate 2.

In a second section 11, the outer areas 9 are arranged in a manner inclined inward and, in the second section 11, the diameter of the structure 5 decreases with increasing distance from the substrate 2. In the second section 11, the outer areas 9 are arranged in accordance with the semipolar planes of the wurtzite crystal that are arranged in a manner inclined inward. A plane 12 is formed in the region of a free end 25 of the structure 5, which plane is formed substantially perpendicularly to the longitudinal extent of the structure 5. The plane 12 is arranged in accordance with the polar c-plane (0001) of the wurtzite crystal. The semiconductor layer structure 6 is arranged parallel to the planes of the outer areas 9 of the structure 5. Therefore, the active zone 7 and the corresponding quantum well layers and barrier layers are also formed parallel to the outer areas 9 of the structure 5 in the longitudinal direction of the assembly in a plurality of planes arranged in a manner inclined with respect to one another.

By way of example, the band gap of the active zone 7 can decrease within a plane continuously and/or in a plurality of steps in the direction of the free end 25 of the structure 5. Consequently, by way of example, the band gap of the active zone 7 decreases continuously and/or in steps within the plane of the first section 10 in the direction of the free end 25 of the structure 5. Likewise, the band gap of the active zone 7 can decrease continuously and/or in steps within the plane of the second section 11 in the direction of the free end 25 of the structure 5. More than two planes of the active zone 7 that are inclined with respect to one another can also be provided along the longitudinal axis of the assembly. In the third section 23 arranged above the plane 12, the active zone 7 has a constant band gap, for example, which is less than or equal to the band gap of the active zone 7 in the second section 11. The outer layer 8 covers the semiconductor layer structure 6 in the form of a cladding layer. The structure 5 is connected to the substrate 2 by a first end. A second, free end 25 of the structure 5 is arranged opposite the first end in a manner facing away from the substrate 2.

Figure 2:
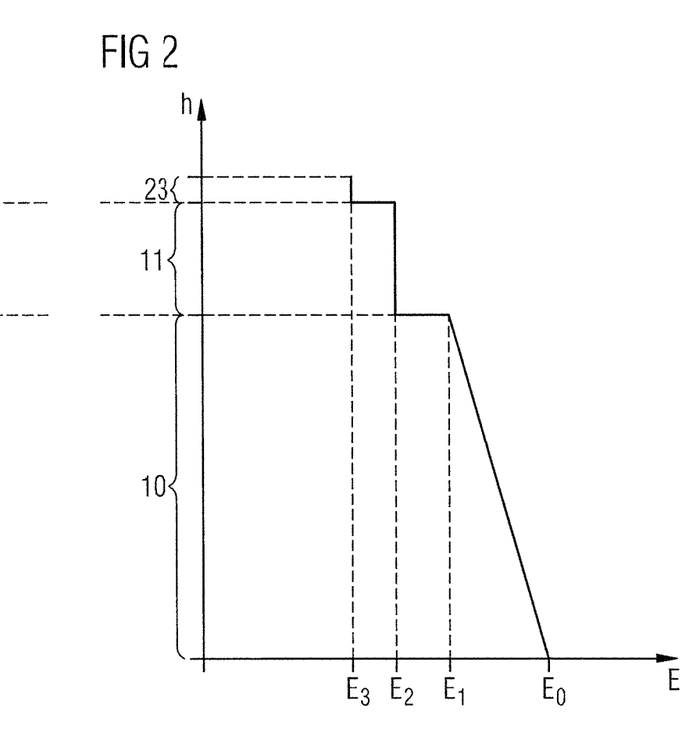
FIG. 2 illustrates a diagram for the profile of the band gap along the longitudinal direction of the assembly.

FIG. 2 shows in a schematic illustration a profile of the energy of the band gap for a radiative recombination of charge carriers in the active zone 7 of the assembly 1 from FIG. 1 along the longitudinal extent of the assembly 1. It can be discerned here that the energy of the band gap, beginning at the mask layer 3, decreases, in particular decreases continuously, in the direction of the free end 25 of the structure 5 in the first section 10. Upon the transition from the first section 10 to the second section 11 there is a jump in the band gap to a smaller band gap, i.e., to a lower energy of the band gap. There is likewise a jump in the energy of the band gap to an even lower level upon the transition from the second section 11 to the third section 23 above the plane 12. The diagram illustrates the initial energy E0 for the band gap in the region of the mask layer 3, a first energy level E1 upon the transition from the first section 10 to the second section 11, a second energy level E2 on the second section 11, and a third energy level E3 for the band gap on the third section 23 on the x-axis. The longitudinal extent h of the assembly 1 comprising the first section 10, the second section 11 and a third section 23 above the plane 12 is indicated on the y-axis.

The band gap of the active zone can decrease within a section 10, 11, i.e., within a plane of the active zone, also in steps and/or in steps and continuously.

The energy of the band gap is set in a decreasing manner, for example, by virtue of the thickness of at least one quantum well layer of the active zone which generates electromagnetic radiation increasing with increasing distance from the mask layer 3. If a plurality of quantum well layers are provided, then the thickness of each quantum well layer increases with increasing distance from the mask layer 3. Besides or instead of the increase in the layer thickness, there can be an increase in the indium concentration in the quantum well layer or quantum well layers with increasing distance from the mask layer to form the energy of the band gap in a decreasing manner in the direction of the upper free end 25 of the structure 5.

As a result of the decrease in the energy of the band gap, i.e., as a result of the decrease in the size of the band gap, free charge carriers in the semiconductor layer structure 6 are drawn in the direction of the plane 12 and recombine radiatively in the region above the plane 12 with higher probability. The probability of a radiative recombination in the region above the plane 12 is increased as a result.

It is also possible to use other materials as substrate 2 such as, e.g., silicon or silicon carbide which, if appropriate, are covered with a GaN, AlN, AlGaN or similar buffer layer. In addition, other materials can also be used to form the structure 5. By way of example, indium, gallium, aluminum, phosphorus, nitrogen or other materials of group III and/or V of the chemical periodic system can be used to form the structure 5 and form the semiconductor layer structure 6.

In a further example, the structure 5 can also be positively doped and the outer layer 8 of the semiconductor layer structure 6 can also be negatively doped. In addition, further layers can also be provided which constitute, for example, adhesion layers, barrier layers or mirror layers.

By way of example, the thickness of the quantum well layer can increase by 50% along the first section 10. In addition, in a further example, the concentration of indium in at least one of the quantum well layers of the active zone 7, proceeding from the mask layer 3, can increase by up to 30% or more along the first section 10 as far as the transition to the second section 11. Both the increase in the indium concentration in at least one quantum well layer and the increase in the layer thickness of at least one quantum well layer of the active zone 7 can take place continuously or in a stepwise manner, in particular within a layer plane. In the case of a plurality of quantum well layers in the active zone, the increase in the thickness and/or the increase in the indium concentration can be provided in each quantum well layer. The outer area 9 of the structure 5 can constitute, for example, an m-plane of the wurtzite crystal structure. In addition, the second section 11 can be formed by r-planes or other semipolar planes of the wurtzite crystal structure. Furthermore, the plane 12 of the structure 5 can be formed by a c-plane of the wurtzite crystal structure.

A contact layer 13 is applied on the outer layer 8, which contact layer is substantially transmissive to the electromagnetic radiation generated by the active zone 7 and is used to electrically contact the outer layer 8 and thus the p-side of the assembly 1. The contact layer 13 can consist of a TCO material such as indium tin oxide, for example. Moreover, a mirror layer 14 can be applied to the masking layer 3, which mirror layer reflects the electromagnetic radiation generated by the active zone 7 upward away from the substrate 2. The n-side of the assembly electrically contacts, for example, via the structure 5 and/or via the substrate 2. The mirror layer 14 can be electrically conductive and can be provided to electrically contact the contact layer 13. An electrically conductive further contact layer 24 that electrically contacts the contact layer 13 can be provided between the mask layer 3 and the mirror layer 14. The structure 5 can be electrically contacted via the substrate or via a further electrical contact layer applied on the substrate.

Figure 3:
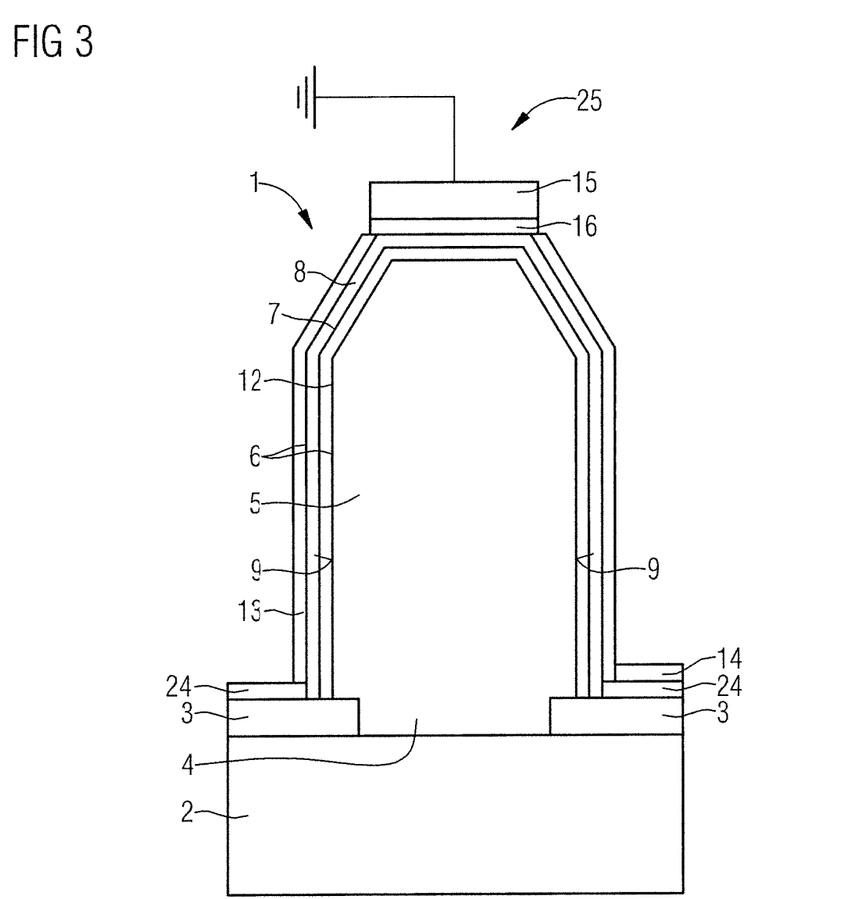
FIG. 3 illustrates a schematic illustration of an electrically biased assembly.

FIG. 3 shows a further example of an assembly 1, which is substantially the same as in FIG. 1, wherein an insulation layer 16 is applied in the region of the free end 25 of the structure 5 above the plane 12 directly on the semiconductor layer structure 6. Consequently, the contact layer 13 does not cover the tip of the semiconductor layer structure 6, but rather only the outer areas 9 in the region of the first and second sections 10, 11. A further electrical contact 15 is provided on the insulation layer 16, the further electrical contact being used to electrically bias the assembly. The further contact 15 is electrically isolated from the contact layer 13 by an insulation layer 16, which is formed from silicon oxide, for example. In this way, a bias voltage can be applied to the free end 25, i.e., the tip of the structure 5 to support transport of free charge carriers in the direction of the plane 12. As a result of the bias voltage, particularly in the case of a relatively large hole mass such as, for example, with the use of gallium nitride for formation of the active zone, the number of available charge carriers can be increased and the threshold current density and the threshold voltage can thus be reduced. The further contact 15 preferably consists of a material transmissive to the electromagnetic radiation generated by the active zone 7.

To produce the structure 5 and the semiconductor layer structure 6, it is possible to use MOVPE methods, but also VPE and MBE methods or sputtering methods. By way of example, during deposition of the quantum well layer of the semiconductor layer structure 6, for example, in an MOVPE method, it is possible to increase the pressure in the MOVPE reactor. Typically, during the MOVPE method, it is possible to use a pressure of 20% to 150% of a customary pressure used in an MOVPE method of depositing a two-dimensional quantum well layer. This leads to a temperature gradient during the deposition of the quantum well layer with somewhat higher temperatures in the region of the substrate 2 and decreasing temperatures with increasing distance from the substrate 2. As a result, the probability of indium being incorporated into the quantum well layer is increased with increasing distance from the substrate 2 such that the concentration of indium in the quantum well layer increases with increasing distance from the substrate 2. Consequently, the energy of the band gap of the quantum well layer for a radiative recombination decreases with increasing distance from the substrate 2.

Furthermore, for deposition of indium gallium nitride quantum well layers with the use of an MOVPE method, pressures and temperatures similar to those for production of two-dimensional indium gallium nitride quantum well layers are used. In this case, TE gallium or TM gallium and TM indium are used as a metal oxide precursor and $NH_3$ is used as a group V source. Doping of the layers and doping of the columnar structure 5 are carried out as in the production of a two-dimensional semiconductor layer structure. By way of example, temperatures of 500° C. to 900° C. are used during deposition of the semiconductor layer structure 6, wherein the temperature is set depending on the desired indium concentration in the quantum well layer.

Furthermore, the thickness of the quantum well layer and concentration of indium in the quantum well layer during deposition depend on orientation of the outer area 9 of the structure 5 onto which the semiconductor layer structure 6 is deposited. During deposition of the active zone, less indium is incorporated into the InGaN quantum well layer in the first section 10 than in the second section 11. Moreover, during deposition, less indium is incorporated into the InGaN quantum well layer in the second section 11 than on the plane 12. The thickness of the quantum well layer in the first section 10, in the second section 11 and in the third section 23 can be constant. Moreover, the thickness of the quantum well layer can be smaller in the first section 10 than in the second section 11 and can be smaller in the third section 23 than in the second section 11. In this example, the indium concentration in the first, second and third sections 10, 11, 23 can be constant. Moreover, in a further example, the indium concentration can be greater in the third section 23 than in the second section 11 and can be greater in the second section 11 than in the first section 10.

Moreover, the energies for the band gaps of the quantum well layers are of different magnitudes even in an identical indium concentration on account of piezoelectric fields on the different planes of the wurtzite crystal. The energy of the band gap is smaller in the third section 23 above the plane 12 (c-plane) than in the second section 11 (r-plane). The energy of the band gap is smaller in the second section 11 (l-plane) than in the first section 10 (m-plane).

Figure 4:
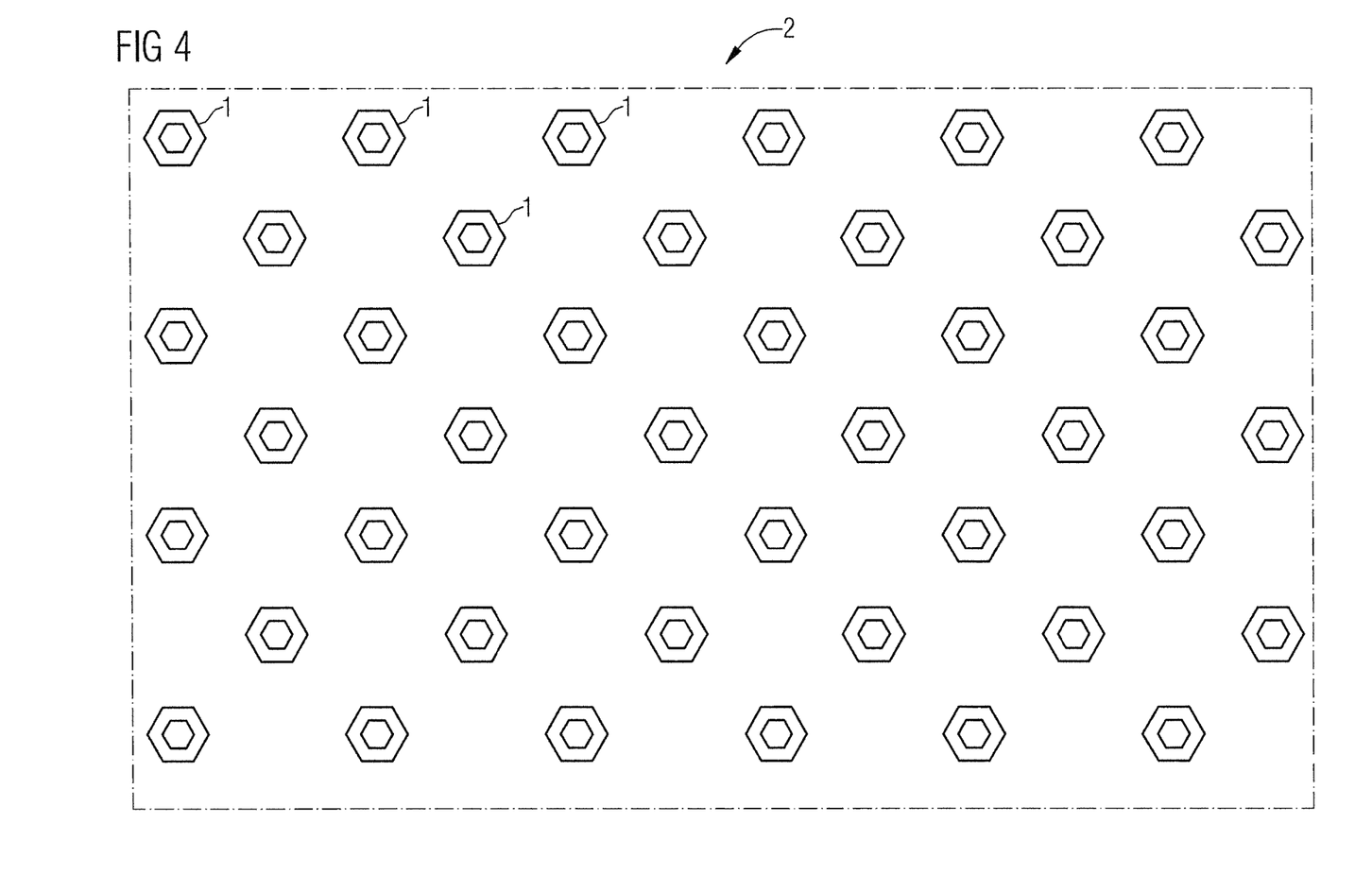
FIG. 4 illustrates one array of assemblies.

FIG. 4 shows an array of a plurality of assemblies 1 in a schematic illustration. The assemblies 1 are, for example, in accordance with the structures in FIG. 1 or 2. The band gap of the active zone of the assemblies 1 in FIG. 4 can also be constant along the longitudinal axis of the assembly.

The array can be used, for example, as an LED array to generate electromagnetic radiation as a sensor array to detect electromagnetic radiation or as a laser array supplied with electromagnetic radiation by an additional radiation source, in particular, a laser as pump source. In the example as a sensor array, the semiconductor structure of the assemblies is electrically biased in the reverse direction. When electromagnetic radiation is incident in the array, resistance of the semiconductor structure changes and a signal can be identified at the electrical terminals of each assembly or of the array.

Figure 5:
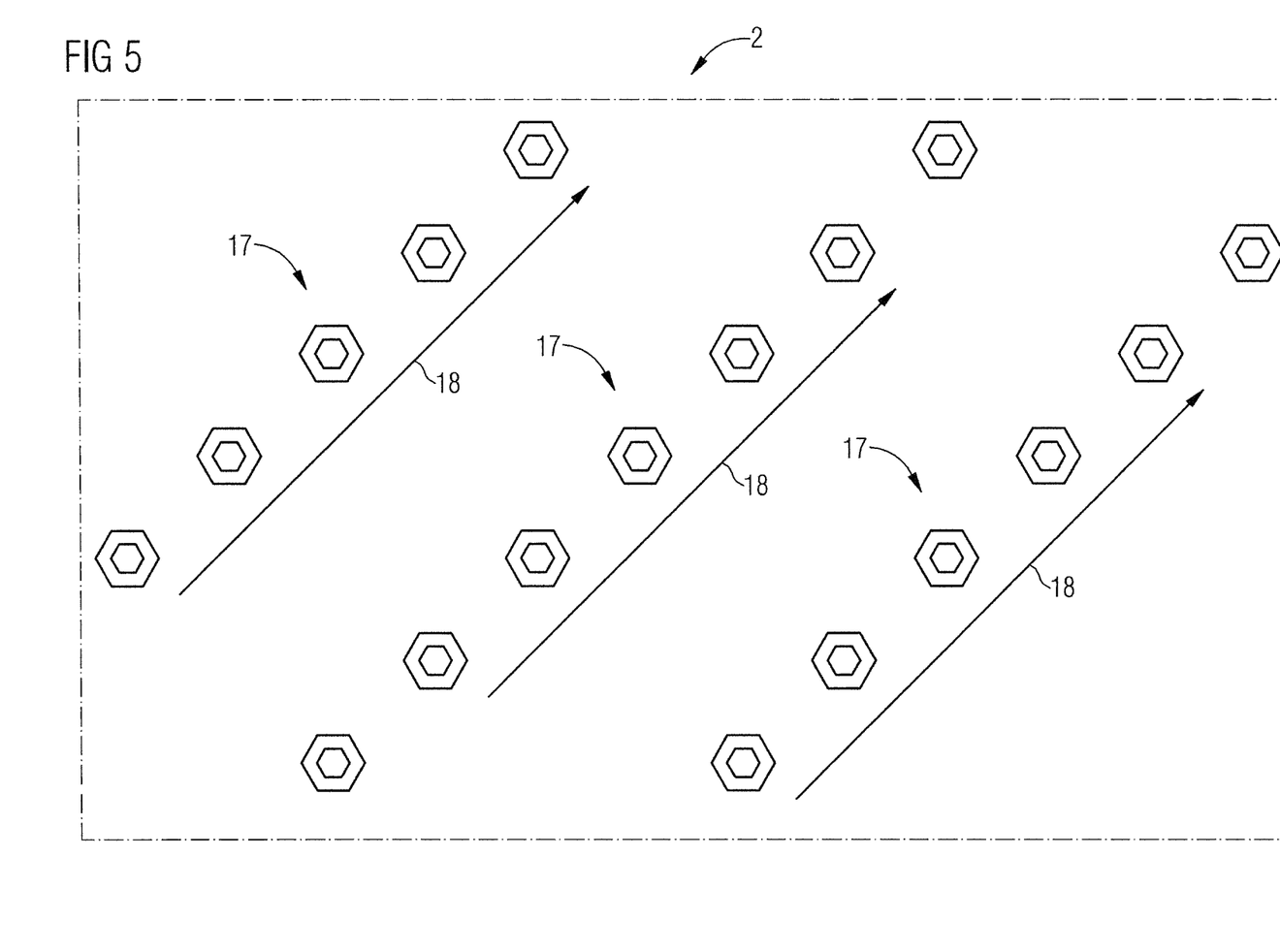
FIG. 5 illustrates a further array of assemblies.

FIG. 5 shows a further of an array in which the assemblies 1 are arranged in rows 17, wherein each row 17 is aligned along a preferred direction 18. The preferred directions 18 of the rows 17 are arranged parallel to one another. The assemblies 1 are, for example, in accordance with the examples in FIG. 1 or 2. The band gap of the active zone of the assemblies 1 in FIG. 5 can also be constant along the longitudinal axis of the assembly, in particular along the first section 10. The arrangement of the assemblies 1 in rows 17 in the preferred directions 18 supports amplification of electromagnetic radiation parallel to the preferred directions 18. Mirror structures, for example, can be obviated in this way. With the aid of the rows 17, the threshold current density can be reduced and at the same time in the preferred direction 18 the electromagnetic radiance can be increased.

Figure 6:
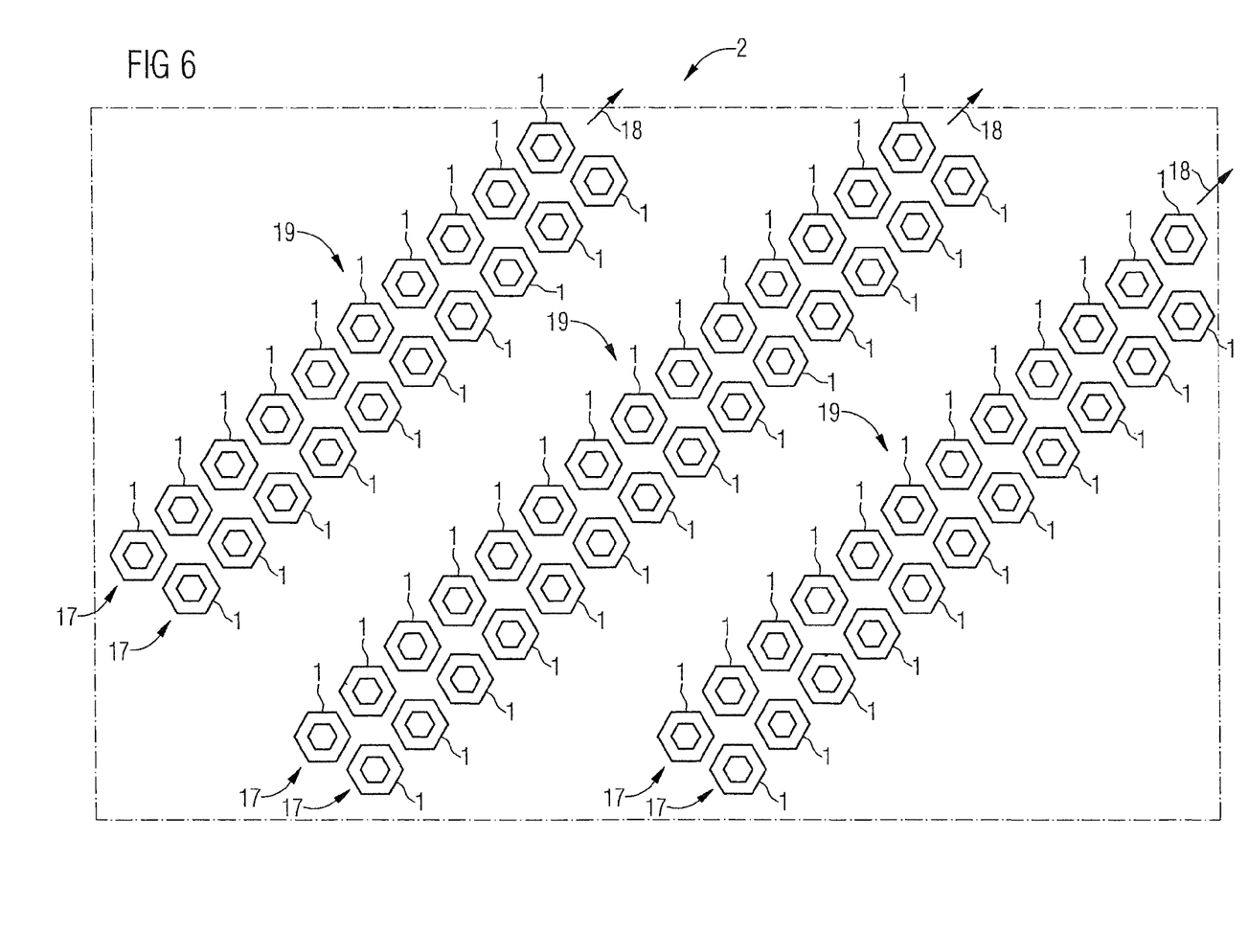
FIG. 6 illustrates an additional array of assemblies.

FIG. 6 shows a further array comprising a plurality of regions 19, wherein each region 19 has two rows 17 of assemblies 1. The rows 17 of the regions 19 are aligned in a preferred direction 18. In accordance with the example illustrated, the preferred directions 18 of the rows 17 are arranged parallel to one another. It is also possible for more than two rows 17 to be arranged in a region 19. Moreover, the preferred direction 18 of the regions 19 can be aligned differently.

As a result of the increased density of the assemblies 1 in a defined preferred direction 18, the threshold current density is reduced and amplification of the laser radiation along the preferred direction 18 is increased. The assemblies 1 are, for example, in accordance with the examples in FIG. 1 or 2. The band gap of the active zone of the assemblies 1 in FIG. 6 can also be constant along the longitudinal axis of the assembly, in particular along the first section 10.

Figure 7:
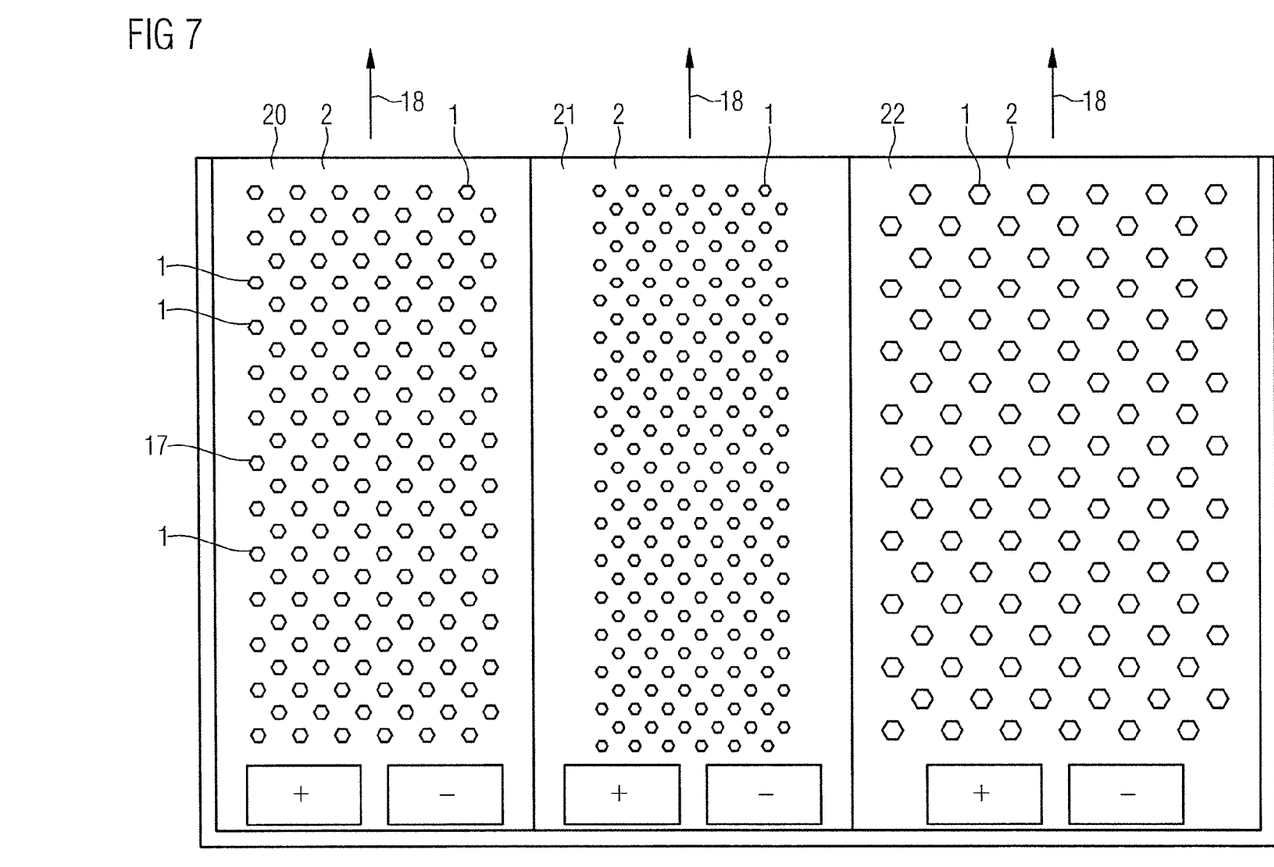
FIG. 7 illustrates a further array of assemblies.

FIG. 7 shows a further array comprising three regions 20, 21, 22. The assemblies 1 are, for example, in accordance with the examples in FIG. 1 or 2. The band gap of the active zone of the assemblies 1 in FIG. 7 can also be constant along the longitudinal axis of the assembly, in particular along the first section 10.

Assemblies 1 whose generated electromagnetic radiation is in a first wavelength range are arranged in the first region 20. Assemblies 1 whose generated electromagnetic radiation is in a second wavelength range are arranged in a second region 21. Assemblies 1 whose generated electromagnetic radiation is in a third wavelength range are arranged in a third region 22. By way of example, the first wavelength range can constitute electromagnetic radiation having the color red, the second wavelength range can constitute electromagnetic radiation having the color green and the third electromagnetic wavelength range can constitute electromagnetic radiation having the color blue. The three regions 20, 21, 22 are preferably arranged on an individual chip. The first region 20 generates, for example, green light, the second region 21 blue light and the third region 22 red light. The assemblies 1 are preferably arranged in rows 17 with the preferred direction 18 thereof aligned parallel to one another, as is illustrated in FIGS. 5 and 6.

Furthermore, the assemblies 1 of the different regions 20, 21, 22 can differ in terms of the construction and also in terms of the size and also in terms of the density, i.e., in terms of the distances between the adjacent assemblies 1. By virtue of the array illustrated in FIG. 7, it is possible to provide a chip comprising an array comprising assemblies 1 which emits different colors.

A high output power of the electromagnetic radiation is achieved as a result of the high density of the assemblies on a chip. The output power of the electromagnetic radiation can be set by the density and/or the number of the assemblies.

The assemblies constituting nanostructures can be produced on large areas of cost-effective substrates. The production methods are similar to the production methods for two-dimensional semiconductor layer structures having active zones that generate electromagnetic radiation. The assemblies can be combined with other optoelectronic devices and/or evaluation circuits to provide new functionalities. By way of example, an array of assemblies can be combined with a radiation source, for example, a laser or an LED, wherein the radiation source excites the array of the assemblies to radiate by electromagnetic radiation having a shorter wavelength than the wavelength of the electromagnetic radiation generated by the assemblies.

In addition, it is possible to combine regions of assemblies with different colors such as, e.g., red, yellow, blue and/or green, on a single chip. By way of example, it is possible to use the arrays with assemblies to realize light projectors. Moreover, it is possible to produce a VCSEL laser with the aid of the arrays, wherein a mirror layer is formed both on the side of the substrate and parallel thereto at a defined distance. By way of example, planar Bragg reflectors constructed from alternate low and high refractive index layers are used as mirror layers. The layers each have an optical path length of one quarter of the wavelength of the electromagnetic radiation of the assemblies.

Furthermore, an array comprising assemblies can be combined with a flash memory (EEPROM) or integrated into a flash memory. The assemblies can be coupled to an optical fiber for the purpose of information or data transfer. Furthermore, an array of assemblies can be combined with a solar cell. In particular, an array of assemblies can be supplied with current by a solar cell.

As materials to form the assemblies, in particular to form the active zone, it is possible to use all semiconducting materials which enable a direct band transition with a radiative recombination for charge carrier pairs and which enable formation of an active zone with a locally changing band gap.

By way of example, it is possible to use boron nitride, gallium antimonide, gallium arsenide, gallium nitride, gallium arsenide phosphide, indium antimonide, indium arsenide, indium nitride, indium phosphide, aluminum gallium arsenide, indium gallium arsenide, indium gallium phosphide, aluminum indium arsenide, gallium arsenide phosphide, gallium arsenide antimonide, aluminum gallium nitride, indium gallium nitride, aluminum gallium indium phosphide, gallium indium arsenide antimonide phosphide, cadmium selenide, zinc oxide, zinc selenide, zinc sulfide, zinc telluride, cadmium zinc telluride, copper chloride, copper sulfide, lead selenide, copper indium gallium selenide, copper zinc tin sulfide, copper indium selenide as materials forming the active zone to generate electromagnetic radiation. By way of example, to form the structure 5, the active zone 7 and/or the outer layer 13, the following material composition can be used: $Al_xGa_yIn_zB_vN_aAs_bP_cSb_d$ where $v+x+y+z \le 1$, where $a+b+c+d \le 1$, where $0 \le a,b,c,d,v,x,y,z \le 1$. By a corresponding variation of the thickness of at least one quantum well layer of the active zone and/or a variation of the composition of the material of the active zone, in particular of at least one quantum well layer of the active zone, with a ternary and/or a quaternary compound, for example, a decrease in the band gap in the active zone for a radiative recombination in the direction of the free end 25 of the structure 5 is achieved.

Figure 8:
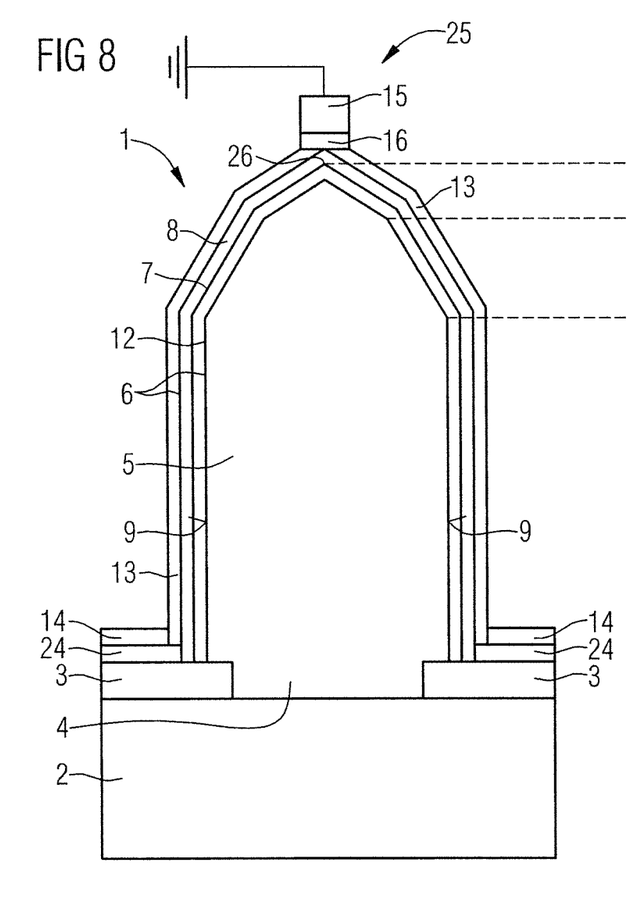
FIG. 8 illustrates a further example of an assembly.

FIG. 8 shows a further example of an assembly constructed substantially in accordance with the assembly in FIG. 1. However, in contrast to the assembly in FIG. 1, the surface 9 of the structure 5 in the third section 23 is not a planar plane perpendicular to the longitudinal axis of the structure 5, rather a plurality of areas are formed and arranged in a manner inclined at an angle of less than 90° with respect to the longitudinal axis. In the third section 23, therefore, a plurality of semipolar areas of the structure 5 are formed on which the semiconductor layer structure 6 having the active zone 7 is also arranged.

The semipolar areas of the outer area 9 of the structure 5 in the third section 23 meet at a common upper point 26. Likewise, the areas of the semiconductor layer structure 6 in the third section 23 meet at a point above the point 26. Consequently, the active zone 7 above the point 26 forms a small circular area, for example, and can have a diameter of less than 10 nm, for example. Consequently, the zone 7 above the point 26 can converge in a quantum dot.

The surface 9 of the structure 5 in the third section 23 can also form areas which merge into a plane arranged perpendicularly to the longitudinal axis of the structure 5. In this example, the active zone 7 above the plane can also form a larger planar area as shown in FIG. 1. Moreover, the assembly can comprise an insulation layer 16 and a further contact 15 to electrically bias the tip of the assembly. The contact 15 and the insulation layer 16 can also be dispensed with.

Figure 9:
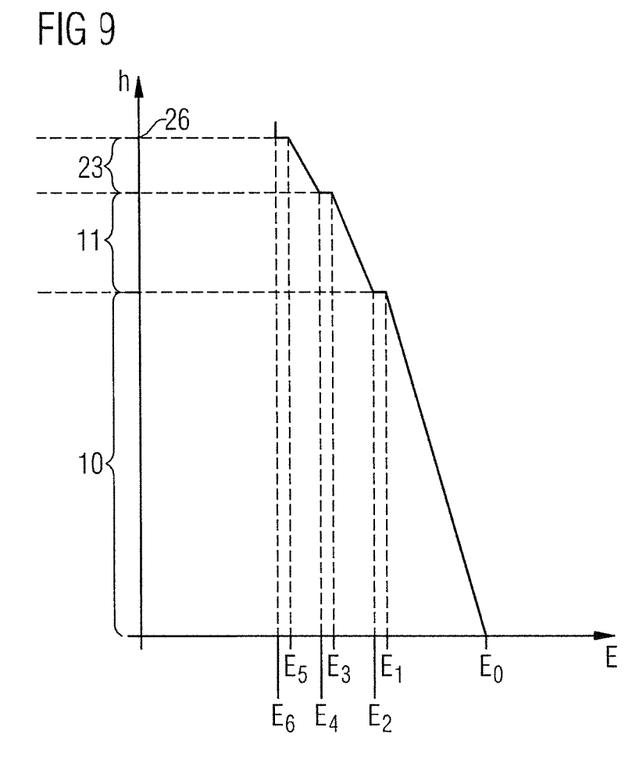
FIG. 9 illustrates a diagram with a profile of the energy of the band gap along a longitudinal axis of the assembly from FIG. 8.

FIG. 9 shows in a schematic illustration the profile of the band edge along the longitudinal axis of the assembly 1. Along the first section 10, the energy of the band gap decreases proceeding from the mask layer 3 in the direction of the free end of the assembly 1 from a zero energy E0 to a first energy E1. At the transition with the second section 11, the band gap decreases to a second energy E2. Along the second section 11, the energy of the band gap decreases from the second energy E2 to a third energy E3. At the transition with the third section 23, the energy of the band gap decreases from the third energy E3 to a fourth energy E4. Along the third section 23, the energy of the band gap decreases in the direction of the free end of the assembly 1 from the fourth energy E4 to a fifth energy E5. At the transition with the quantum dot, the energy of the band gap can remain constant at the fifth energy or decrease to a sixth energy E6. The band gap can decrease continuously, discontinuously and/or in a stepwise manner in the direction of the free end of the assembly.

Figure 10:
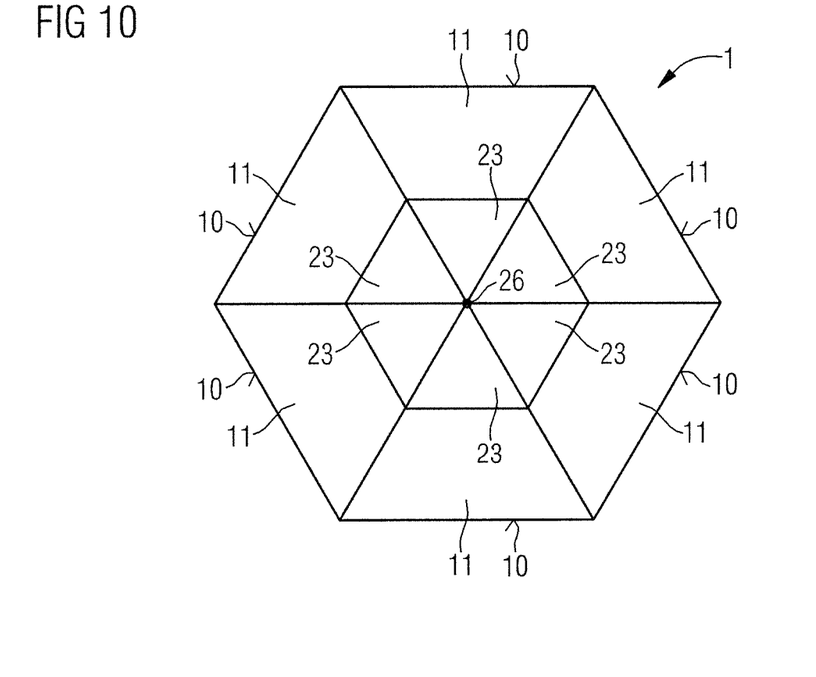
FIG. 10 illustrates a schematic view from above of the assembly from FIG. 8.

FIG. 10 shows in a schematic illustration a view from above of an assembly 1 from FIG. 8.

In the figures illustrated, the semiconductor layer structure 6 is embedded in a cladding-type fashion and substantially covers the entire surface 9 of the structure 5. It is also possible for only partial areas of the surface 9 of the structure 5 to be covered with the semiconductor layer structure 6, wherein at least one partial areas extends right into the region of the free end of the structure.

Figure 11:
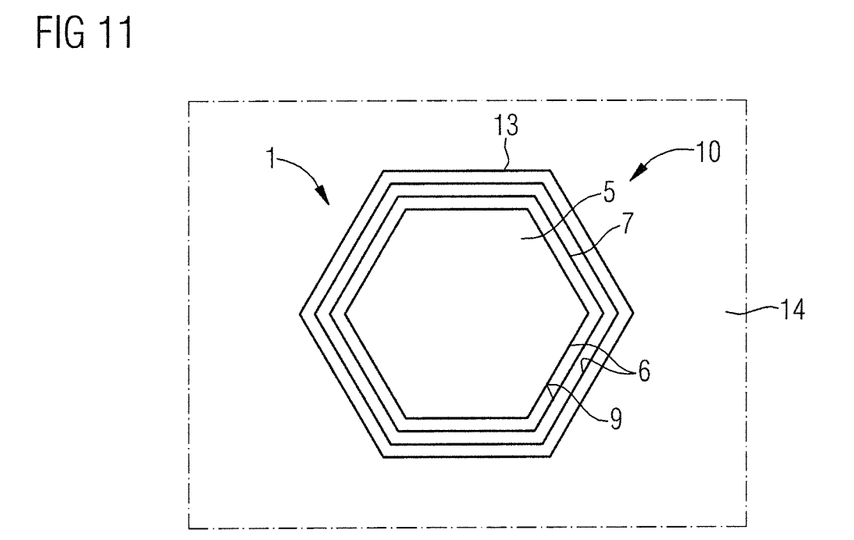
FIG. 11 illustrates a cross section through the assembly from FIG. 1 in the first section.

FIG. 11 shows a schematic cross section through the assembly 1 from FIG. 1 in the first section. Discernible here is the semiconductor layer structure 6 extending circumferentially in a cladding-type fashion and having the active zone 7, which covers the outer area 9 of the structure 5. The contact layer 13 is likewise a cladding on the semiconductor layer structure 6. In the example illustrated, the structure 5 has a hexagonal basic area. The structure 5 can also have other basic areas, in particular, the basic area can have fewer or more vertices. The assembly 1 has an analogous cross section in the second section 11, wherein the area of the structure 5 is made smaller. If a third section 23 is provided, as is illustrated in FIGS. 8 and 10, then the third section 23, too, has an analogous cross section.

Although our assemblies have been more specifically illustrated and described in detail by the preferred examples, nevertheless this disclosure is not restricted by the examples disclosed and other variations can be derived therefrom by those skilled in the art, without departing from the scope of protection of the appended claims.

This disclosure claims the priority of DE 102013104273.2, the disclosure of which is hereby incorporated by reference.

The invention claimed is:

1. An assembly comprising a columnar structure arranged with one end on a substrate, wherein 1) the structure is at least partly covered with a semiconductor layer structure having an active zone that generates electromagnetic radiation, 2) the active zone has a band gap for a radiative recombination, 3) the band gap decreases along a longitudinal axis of the structure in a direction of a free end of the structure such that a diffusion of charge carriers in the direction of the free end of the structure and a radiative recombination of charge carrier pairs in the region of the free end of the structure are supported, and 4) a material composition of a quantum well layer changes at least in one section in the direction of the free end of the structure such that the band gap decreases in the direction of the free end of the structure.

2. The assembly according to claim 1, wherein the active zone covers at least 85% of the outer area of the columnar structure.

3. The assembly according to claim 1, wherein a thickness of at least one quantum well layer of the active zone increases at least in one section in the direction of the free end of the structure.

4. The assembly according to claim 1, wherein the band gap decreases continuously at least in one section in the direction of the free end.

5. The assembly according to claim 1, wherein the active zone is arranged at least in two planes in a longitudinal direction of the structure, the two planes are arranged in a manner inclined with respect to one another, and the band gap decreases at least in one plane in the direction of the free end at least in one section.

6. The assembly according to claim 1, wherein the band gap decreases continuously and/or discontinuously and/or in a stepwise manner at least in one plane in the direction of the free end.

7. The assembly according to claim 1, wherein the active zone comprises an InGaN layer, and a concentration of indium increases continuously and/or in a stepwise manner at least in one section of a plane in the direction of the free end.

8. The assembly according to claim 1, wherein the columnar structure has a crystal structure, an outer area of the structure undergoes transition from a first crystal plane into a second crystal plane in the direction of the free end of the structure, and the active zone is on the two crystal planes in two planes such that the band gap of the active zone decreases from the first plane to the second plane.

9. The assembly according to claim 1, wherein the columnar structure is subdivided into three sections along a longitudinal direction, in a first section a diameter of the structure is substantially constant in the direction of the free end of the structure, in a subsequent second section a diameter of the structure decreases, a third section of the structure is adjacent to the second section, an end region of the active zone is arranged on a plane at the free end of the structure in the third section, and the plane is arranged substantially perpendicularly with respect to a longitudinal axis of the structure and in a punctiform fashion.

10. A method of producing the assembly according to claim 1, wherein a columnar structure composed of an electrically conductive material composed of a semiconductor material is produced on a substrate, and a semiconductor layer structure having an active zone that generates electromagnetic radiation is formed at least on part of the structure such that a band gap of the active zone for a radiative recombination of charge carriers decreases along a longitudinal axis of the structure in the direction of a free end of the structure such that a diffusion of charge carriers in the direction of the free end of the structure and a radiative recombination of charge carrier pairs in the region of the free end of the structure are supported.

11. The method according to claim 10, wherein the active zone is deposited such that a thickness of at least one quantum well layer for a radiative recombination increases in the direction of the free end of the structure.

12. The method according to claim 10, wherein the active zone is deposited such that a material composition of the active zone changes along a longitudinal extent of the structure in the direction of the free end of the structure such that a resulting band gap decreases.

13. An array comprising a substrate and a plurality of assemblies, each assembly comprising a columnar structure arranged with one end on said substrate, wherein the structure is at least partly covered with a semiconductor layer structure having an active zone that generates electromagnetic radiation, wherein the active zone has a band gap for a radiative recombination, the band gap decreases along a longitudinal axis of the structure in a direction of a free end of the structure such that a diffusion of charge carriers in the direction of the free end of the structure and a radiative recombination of charge carrier pairs in the region of the free end of the structure are supported, and a higher density of assemblies is provided in at least one direction than in at least one second direction.

14. The array according to claim 13, wherein at least two rows of assemblies are provided, and the rows are aligned parallel to one another.

15. The array according to claim 13, wherein at least two regions of rows are provided, at least two rows of assemblies are arranged parallel in each region, the two regions are arranged parallel to one another, and the two regions are at a distance from one another perpendicularly in relation to alignment of the assemblies, which distance is greater than an average distance between two assemblies in a region.

16. The array according to claim 13, wherein the active zones of the assemblies of the different regions have on average different band gaps and/or the assemblies of the regions are at different distances from one another.

17. The array according to claim 13, wherein the array is an array of lasers.

18. An assembly comprising a columnar structure arranged with one end on a substrate, wherein 1) the structure is at least partly covered with a semiconductor layer structure having an active zone that generates electromagnetic radiation, 2) the active zone has a band gap for a radiative recombination, 3) the band gap decreases along a longitudinal axis of the structure in a direction of a free end of the structure such that a diffusion of charge carriers in the direction of the free end of the structure and a radiative recombination of charge carrier pairs in the region of the free end of the structure are supported, 4) an insulation layer is provided in a free end region of the structure on the active zone, and an electrical contact for electrical biasing is provided on the insulation layer, and 5) the electrical contact is electrically isolated from the active zone by the insulation layer.

* * * * *